US012176405B1

(12) United States Patent
Lim et al.

(10) Patent No.: US 12,176,405 B1
(45) Date of Patent: Dec. 24, 2024

(54) FIELD-EFFECT TRANSISTORS WITH AIRGAP SPACERS

(71) Applicant: GlobalFoundries Singapore Pte. Ltd., Singapore (SG)

(72) Inventors: Khee Yong Lim, Singapore (SG); Xinfu Liu, Singapore (SG); Xiao Mei Elaine Low, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 0 days.

(21) Appl. No.: 18/664,386

(22) Filed: May 15, 2024

(51) Int. Cl.
*H01L 29/417* (2006.01)
*H01L 21/764* (2006.01)
*H01L 29/423* (2006.01)
*H01L 29/66* (2006.01)

(52) U.S. Cl.
CPC ...... *H01L 29/41783* (2013.01); *H01L 21/764* (2013.01); *H01L 29/42356* (2013.01); *H01L 29/42376* (2013.01); *H01L 29/6656* (2013.01)

(58) Field of Classification Search
CPC ......... H01L 21/28114; H01L 21/28587; H01L 21/7682; H01L 21/764; H01L 21/823418; H01L 21/823425; H01L 21/823437; H01L 21/823468; H01L 21/823814; H01L 21/823864; H01L 21/823828–82385; H01L 29/41775–41783; H01L 29/42376; H01L 29/4983; H01L 29/4991; H01L 2221/1042; H01L 2221/1047
See application file for complete search history.

(56) References Cited

U.S. PATENT DOCUMENTS

| 6,506,649 | B2 | 1/2003 | Fung et al. |
| 6,633,070 | B2 * | 10/2003 | Miura ............... H01L 29/4991 |
| | | | 257/E21.205 |
| 6,891,235 | B1 | 5/2005 | Furukawa et al. |

(Continued)

OTHER PUBLICATIONS

L. Lucci et al., "Optimizing RFSOI Performance through a T-shaped Gate and Nano-Second Laser Annealing Techniques," 2023 IEEE Radio Frequency Integrated Circuits Symposium (RFIC), San Diego, CA, USA, 2023, pp. 61-64, doi: 10.1109/RFIC54547.2023. 10186137.

(Continued)

*Primary Examiner* — Victoria K. Hall
(74) *Attorney, Agent, or Firm* — Thompson Hine LLP; Francois Pagette

(57) ABSTRACT

Structures for a field-effect transistor and methods of forming a structure for a field-effect transistor. The structure comprises a semiconductor layer, a first raised source/drain region on the semiconductor layer, a second raised source/drain region on the semiconductor layer, a gate electrode laterally between the first raised source/drain region and the second raised source/drain region, a first airgap laterally between the first raised source/drain region and the gate electrode, and a second airgap laterally between the second raised source/drain region and the gate electrode. The gate electrode includes a first section and a second section between the first section and the semiconductor layer, the first section of the gate electrode has a first width, the second section of the gate electrode has a second width, and the first width is greater than the second width.

18 Claims, 4 Drawing Sheets

(56) References Cited

U.S. PATENT DOCUMENTS

| | | | |
|---|---|---|---|
| 9,117,805 B2* | 8/2015 | Niebojewski | H01L 21/28008 |
| 9,190,486 B2* | 11/2015 | Xie | H01L 21/28114 |
| 9,536,982 B1* | 1/2017 | Cheng | H01L 29/517 |
| 10,832,962 B1 | 11/2020 | Cheng et al. | |
| 11,011,638 B2 | 5/2021 | Xie et al. | |
| 11,127,831 B2 | 9/2021 | Liu et al. | |
| 2002/0163036 A1* | 11/2002 | Miura | H01L 29/4991 |
| | | | 257/E21.205 |
| 2009/0212332 A1 | 8/2009 | Wang et al. | |
| 2014/0138779 A1* | 5/2014 | Xie | H01L 29/66553 |
| | | | 257/401 |
| 2014/0217520 A1* | 8/2014 | Niebojewski | H01L 29/49 |
| | | | 257/288 |
| 2017/0125284 A1* | 5/2017 | Cheng | H01L 29/66795 |
| 2017/0125539 A1* | 5/2017 | Cheng | H01L 29/66545 |

OTHER PUBLICATIONS

C.-T. Lin et al., "Impacts of Notched-Gate Structure on Contact Etch Stop Layer (CESL) Stressed 90-nm nMOSFET," in IEEE Electron Device Letters, vol. 28, No. 5, pp. 376-378, May 2007, doi: 10.1109/LED.2007.895425.

S. Monfray et al., "Optimized Si/SiGe notched gates for CMOS," 31st European Solid-State Device Research Conference, Nuremberg, Germany, 2001, pp. 275-278, doi: 10.1109/ESSDERC.2001.195254.

\* cited by examiner

FIELD-EFFECT TRANSISTORS WITH AIRGAP SPACERS

BACKGROUND

The disclosure relates generally to semiconductor devices and integrated circuit fabrication and, in particular, to structures for a field-effect transistor and methods of forming a structure for a field-effect transistor.

Complementary-metal-oxide-semiconductor (CMOS) processes may be employed to build field-effect transistors that are used to construct, for example, a switch in a radio-frequency integrated circuit. A field-effect transistor generally includes a source, a drain, a semiconductor body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current. Conventional field-effect transistors may exhibit an undesirably high value of off-capacitance in combination with an unacceptably low breakdown voltage, which in combination may be detrimental to device performance.

Improved structures for a field-effect transistor and methods of forming a structure for a field-effect transistor are needed.

SUMMARY

In an embodiment of the invention, a structure for a field-effect transistor is provided. The structure comprises a semiconductor layer, a first raised source/drain region on the semiconductor layer, a second raised source/drain region on the semiconductor layer, a gate electrode laterally between the first raised source/drain region and the second raised source/drain region, a first airgap laterally between the first raised source/drain region and the gate electrode, and a second airgap laterally between the second raised source/drain region and the gate electrode. The gate electrode includes a first section and a second section between the first section and the semiconductor layer, the first section of the gate electrode has a first width, the second section of the gate electrode has a second width, and the first width is greater than the second width.

In an embodiment of the invention, a method of forming a structure for a field-effect transistor is provided. The method comprises forming a first raised source/drain region and a second raised source/drain region on a semiconductor layer, forming a gate electrode laterally between the first raised source/drain region and the second raised source/drain region, forming a first airgap laterally between the first raised source/drain region and the gate electrode, and forming a second airgap laterally between the second raised source/drain region and the gate electrode. The gate electrode includes a first section and a second section between the first section and the semiconductor layer, the first section of the gate electrode has a first width, the second section of the gate electrode has a second width, and the first width is greater than the second width.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
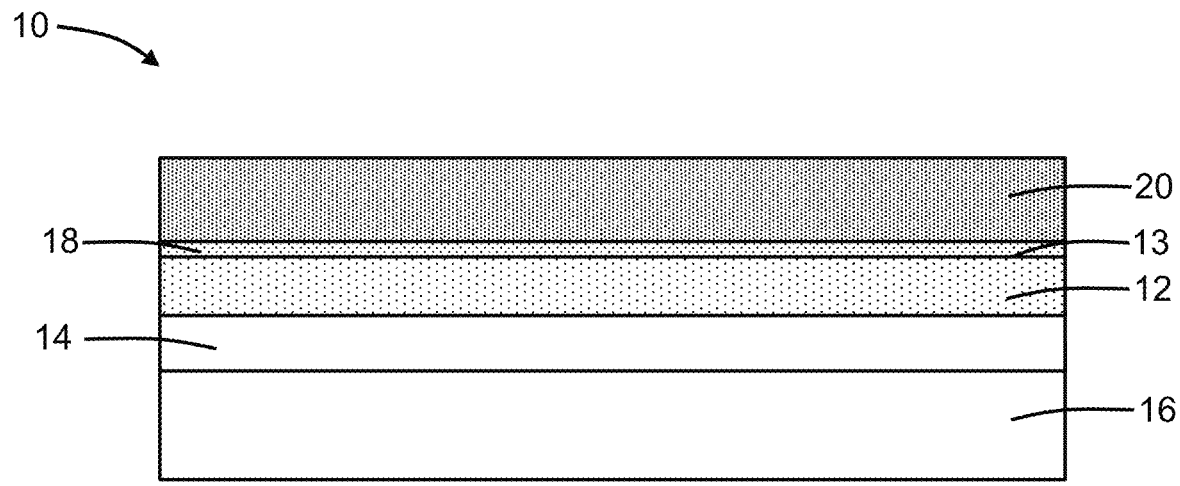
FIG. 1 is a cross-sectional view of a structure at an initial fabrication stage of a processing method in accordance with embodiments of the invention.

With reference to FIG. 1 and in accordance with embodiments of the invention, a structure 10 for a field-effect transistor includes a semiconductor layer 12, a dielectric layer 14, and a handle substrate 16. The semiconductor layer 12, which is separated from the handle substrate 16 by the intervening dielectric layer 14, may be substantially thinner than the handle substrate 16. The semiconductor layer 12 is electrically isolated from the handle substrate 16 by the dielectric layer 14. The semiconductor layer 12 and the handle substrate 16 may be comprised of a semiconductor material, such as single-crystal silicon. The dielectric layer 14 may be comprised of a dielectric material, such as silicon dioxide. The semiconductor layer 12, dielectric layer 14, and handle substrate 16 may constitute a silicon-on-insulator substrate with the semiconductor layer 12 having a thickness suitable to form either a partially-depleted field-effect transistor or a fully-depleted field-effect transistor.

A gate dielectric layer 18 and a semiconductor layer 20 may be formed in a layer stack on the semiconductor layer 12. In an embodiment, the gate dielectric layer 18 may be comprised of silicon dioxide formed by an oxidation process that oxidizes an upper portion of the semiconductor layer 12. The semiconductor layer 20 may be comprised of a material, such as doped polysilicon or doped polycrystalline silicon-germanium, suitable for forming a gate electrode of the field-effect transistor and may be deposited by, for example, chemical vapor deposition.

Figure 2:
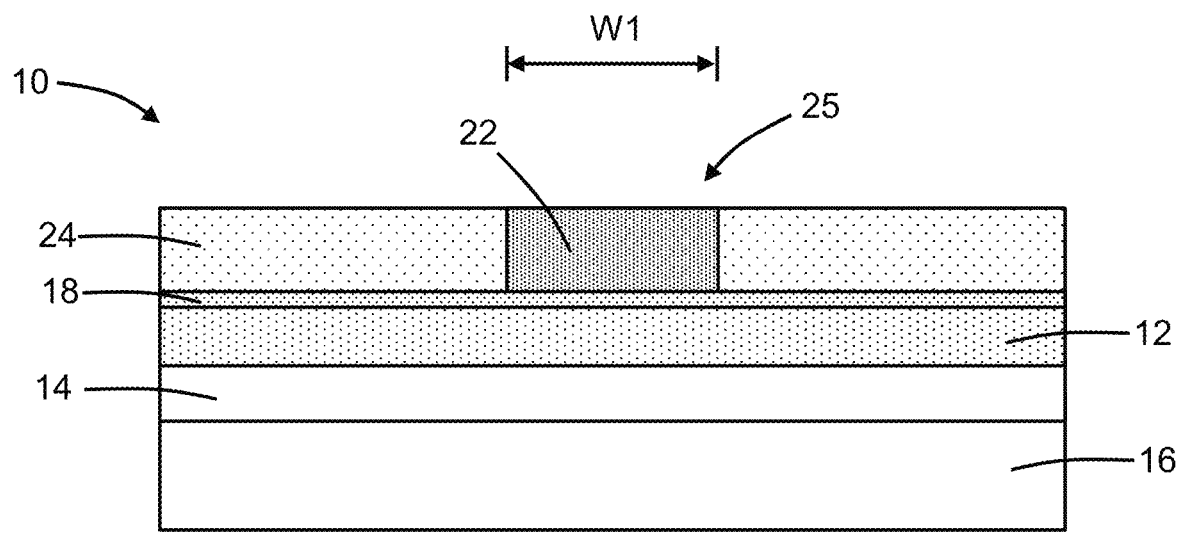
FIG. 2 is a cross-sectional view of the structure at a fabrication stage subsequent to FIG. 1.

With reference to FIG. 2 in which like reference numerals refer to like features in FIG. 1 and at a subsequent fabrication stage, the semiconductor layer 20 may be patterned by lithography and etching processes to form a bottom section 22 of a gate electrode 25. To that end, an etch mask may be formed by a lithography process over the semiconductor layer 20. The etch mask may include a layer of a photoresist applied by a spin-coating process, pre-baked, exposed to light projected through a photomask, baked after exposure, and developed with a chemical developer to define a resist shape on the semiconductor layer 20 at the intended location for the bottom section 22 of the gate electrode 25. An etching process is used to form the bottom section 22 of the gate electrode 25 at the location of the resist shape. The etch mask may be stripped after patterning the bottom section 22 of the gate electrode 25.

A dielectric layer 24 may be formed that covers the portion of the gate dielectric layer 18 surrounding the bottom section 22 of the gate electrode 25. The dielectric layer 24 may be formed by depositing a dielectric material, such as silicon dioxide, and planarizing the deposited dielectric material with chemical-mechanical polishing. The dielectric layer 24 may be coplanar, or in the alternative substantially coplanar, with the top surface of the bottom section 22 of the gate electrode 25.

The bottom section 22 of the gate electrode 25 may be characterized by a width W1 established by the patterning. A portion of the gate dielectric layer 18 is disposed between the bottom section 22 of the gate electrode 25 and the semiconductor layer 12. In an embodiment, the bottom section 22 of the gate electrode 25 may have a sidewall, in contact with the dielectric layer 24, that is non-curved. In an embodiment, the bottom section 22 of the gate electrode 25 may have a sidewall, in contact with the dielectric layer 24, that is planar.

Figure 3:
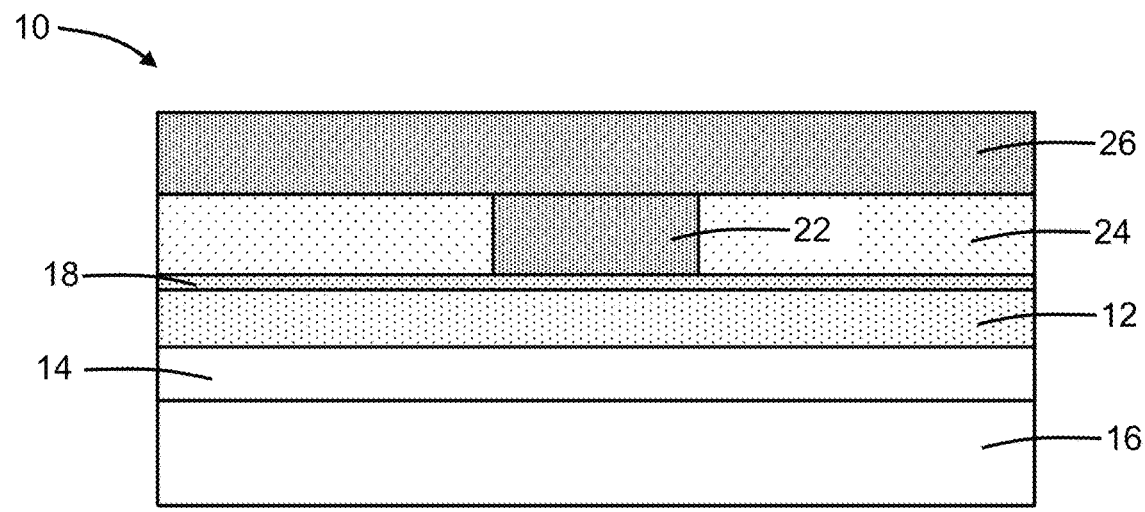
FIG. 3 is a cross-sectional view of the structure at a fabrication stage subsequent to FIG. 2.

With reference to FIG. 3 in which like reference numerals refer to like features in FIG. 2 and at a subsequent fabrication stage, a semiconductor layer 26 may be formed on the bottom section 22 of the gate electrode 25 and the planarized dielectric layer 24. In an embodiment, semiconductor layer 26 may be comprised of a material, such as doped polysilicon, suitable for forming a gate electrode of the field-effect transistor and may be deposited by, for example, chemical vapor deposition. In an embodiment, the semiconductor layer 26 may be comprised of the same material as the bottom section 22 of the gate electrode 25 and the semiconductor layer 20 from which the bottom section 22 is formed. In an alternative embodiment, the semiconductor layer 26 may be comprised of a different material than the bottom section 22 of the gate electrode 25 and the semiconductor layer 20 from which the bottom section 22 is formed. In an embodiment, the semiconductor layer 26 may be comprised of doped polycrystalline silicon and the semiconductor layer 20 may be comprised of doped polycrystalline silicon-germanium.

Figure 4:
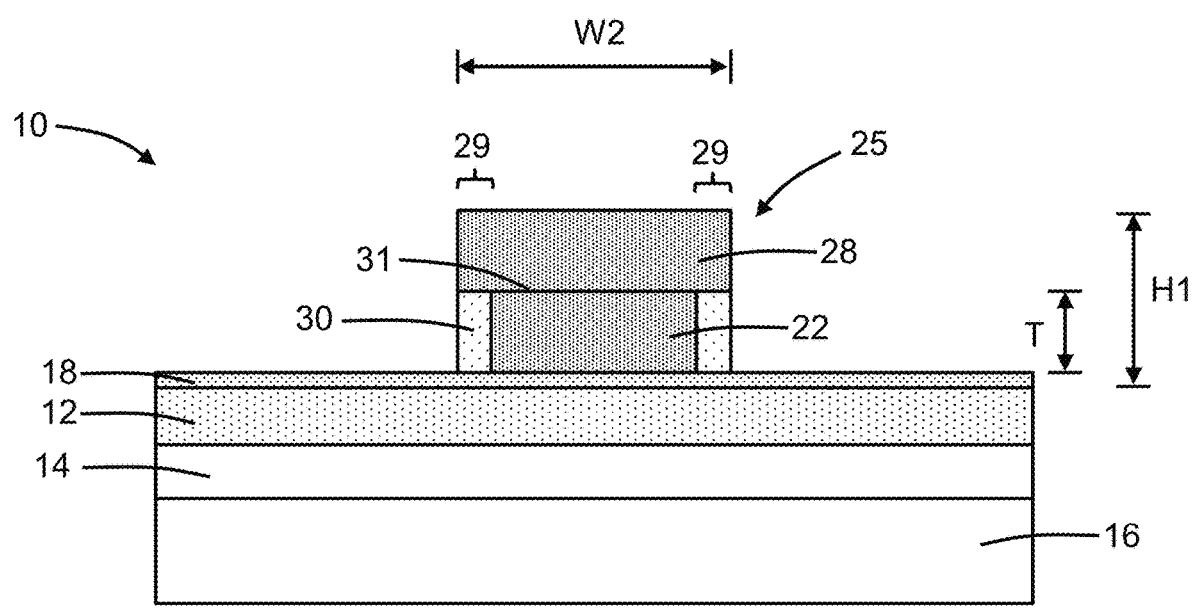
FIG. 4 is a cross-sectional view of the structure at a fabrication stage subsequent to FIG. 3.

With reference to FIG. 4 in which like reference numerals refer to like features in FIG. 3 and at a subsequent fabrication stage, the semiconductor layer 26 and dielectric layer 24 may be patterned by lithography and etching processes to form a top section 28 of the gate electrode 25 and sidewall spacers 30. To that end, an etch mask may be formed by a lithography process over the semiconductor layer 26. The etch mask may include a layer of a photoresist applied by a spin-coating process, pre-baked, exposed to light projected through a photomask, baked after exposure, and developed with a chemical developer to define a resist shape on the semiconductor layer 26 at the intended location for the top section 28 of the gate electrode 25. An etching process is used to form the top section 28 of the gate electrode 25 and the sidewall spacers 30 at the location of the resist shape. The etch mask may be stripped after patterning the top section 28 of the gate electrode 25 and the sidewall spacers 30.

The bottom section 22 of the gate electrode 25 and the top section 28 of the gate electrode 25 are arranged as layers in a layer stack and adjoin along an interface 31 across which the layer identity changes. The bottom section 22 of the gate electrode 25 is disposed between the top section 28 of the gate electrode 25 and the gate dielectric layer 18. Forming the top section 28 of the gate electrode 25 separately from forming the bottom section 22 of the gate electrode 25, and also after forming the bottom section 22 of the gate electrode 25, permits the gate electrode 25 to contain dissimilar materials.

The top section 28 of the gate electrode 25 and the bottom section 22 of the gate electrode 25 may be characterized a height H1, which may be measured from a top surface of the top section 28 to a top surface 13 (FIG. 1) of the semiconductor layer 12. The top section 28 may be characterized by a width W2 established by the patterning that is greater than the width W1 of the bottom section 22. The bottom section 22 of the gate electrode 25 adjoins a portion of the top section 28 of the gate electrode 25 over an area at the interface 31. Due to the width difference, the top section 28 of the gate electrode 25 includes side edge portions 29 that project laterally outward beyond the sidewall of the bottom section 22 of the gate electrode 25. Sidewall spacers 30 are formed from the dielectric layer 24 beneath the side edge portions 29 of the top section 28 of the gate electrode 25 when the top section 28 of the gate electrode 25 and dielectric layer 24 are patterned.

The gate electrode 25 is T-shaped because the top section 28 is wider than the bottom section 22. The side edge portions 29 of the top section 28 of the gate electrode 25 project laterally over, and overlap with, the sidewall spacers 30 such that the sidewall spacers 30 are disposed vertically between the side edge portions 29 and the underlying portions of the gate dielectric layer 18. In an embodiment, the side edge portions 29 of the top section 28 of the gate electrode 25 fully cover, and overlap with, the sidewall spacers 30. In an embodiment, the side edge portions 29 of the top section 28 of the gate electrode 25 may directly contact the sidewall spacers 30. In an embodiment, the side edge portions 29 of the top section 28 of the gate electrode 25 terminate at an inner edge of the sidewall spacers 30 and also at an outer edge of the sidewall spacers 30 such that the sidewall spacers 30 are disposed fully underneath the side edge portions 29. The sidewall spacers 30 and the bottom section 22 of the gate electrode 25 may have equal thicknesses T relative to the top surface 13 of the semiconductor layer 12.

Figure 5:
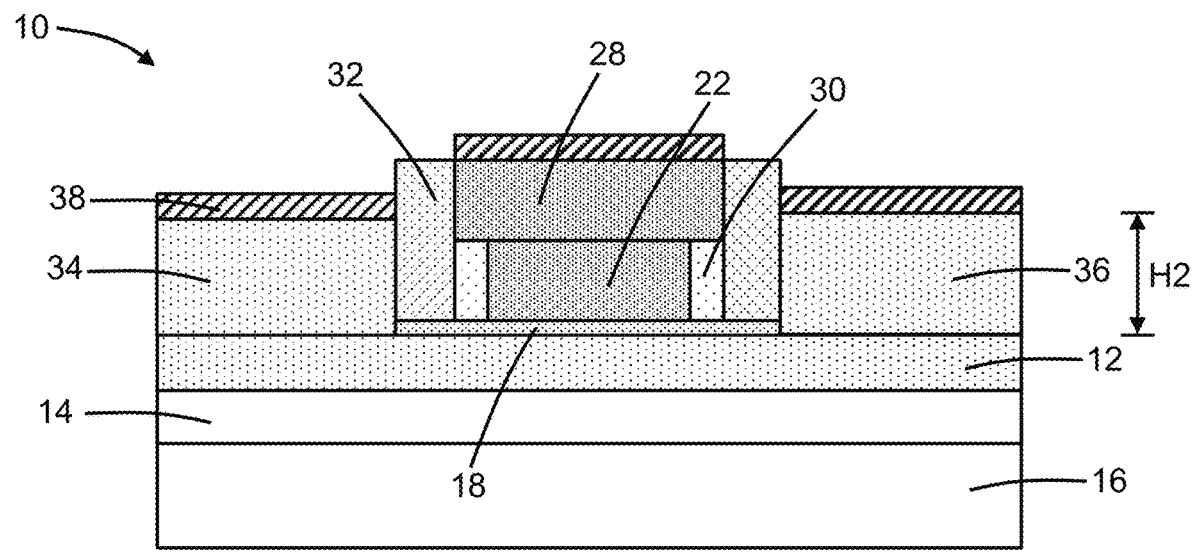
FIG. 5 is a cross-sectional view of the structure at a fabrication stage subsequent to FIG. 4.

With reference to FIG. 5 in which like reference numerals refer to like features in FIG. 4 and at a subsequent fabrication stage, sidewall spacers 32 may be formed as temporary placeholder structures that are positioned adjacent to the bottom section 22 of the gate electrode 25 and the top section 28 of the gate electrode 25. The sidewall spacers 30 are laterally disposed between the sidewall spacers 32 and the bottom section 22 of the gate electrode 25. In an embodiment, the sidewall spacers 32 may be comprised of a different dielectric material than the sidewall spacers 30. In an embodiment, the sidewall spacers 32 may be comprised of a dielectric material, such as silicon nitride.

The gate dielectric layer 18 adjacent to the sidewall spacers 32 may be removed to reveal the portions of the top surface 13 (FIG. 1) of the semiconductor layer 12. Raised source/drain regions 34, 36 of the field-effect transistor may be formed on the revealed portions of the semiconductor layer 12 adjacent to the opposite sides of the gate electrode 25. As used herein, the term "source/drain region" means a doped region of semiconductor material that can function as either a source or a drain of a field-effect transistor. The raised source/drain regions 34, 36 may be characterized by a height H2, which may be measured relative to the top surface 13 of the semiconductor layer 12, that is less than the height H1 of the gate electrode 25 relative to the same reference plane. The sidewall spacers 32 are laterally disposed between the raised source/drain regions 34, 36 and the gate electrode 25, as well as between the sidewall spacers 30 and the raised source/drain regions 34, 36.

The raised source/drain regions 34, 36, which are positioned over underlying stacked portions of the semiconductor layer 12 and the dielectric layer 14, may be comprised of respective layers of a semiconductor material, such as single-crystal silicon. The semiconductor layers of the raised source/drain regions 34, 36 may be formed by an epitaxial growth process and may be doped during epitaxial growth. The semiconductor layers of the raised source/drain regions 34, 36 are doped to have the same conductivity type. In an embodiment, the semiconductor layers of the raised source/drain regions 34, 36 may be doped (e.g., heavily doped) with a concentration of a dopant, such as an n-type dopant (e.g., phosphorus or arsenic) to provide n-type conductivity. In an alternative embodiment, the raised semiconductor layers of the raised source/drain regions 34, 36 may be doped (e.g., heavily doped) with a concentration of a dopant, such as a p-type dopant (e.g., boron) to provide p-type conductivity. In an embodiment, dopant from the raised semiconductor layers of the raised source/drain regions 34, 36 may diffuse, during epitaxial growth or during subsequent thermal processes, into the respective underlying portions of the semiconductor layer 12.

Silicide layers 38 may be formed on the upper surfaces of the top section 28 of the gate electrode 25, the semiconductor layer of the raised source/drain region 34, and the semiconductor layer of the raised source/drain region 36. The silicide layers 38 may be formed by a silicidation process that involves one or more annealing steps to form a silicide phase by reacting the semiconductor material of the top section 28 of the gate electrode 25, the semiconductor material of the raised source/drain region 34, and the semiconductor material of the raised source/drain region 36 with a deposited layer comprised of a silicide-forming metal, such as nickel. An initial annealing step of the silicidation process may consume all or part of the silicide-forming metal to form the silicide layers 38. Following the initial annealing step, any non-reacted silicide-forming metal may be removed by wet chemical etching. The silicide layers 38 may then be subjected to an additional annealing step at a higher temperature to form a lower-resistance silicide phase.

Figure 6:
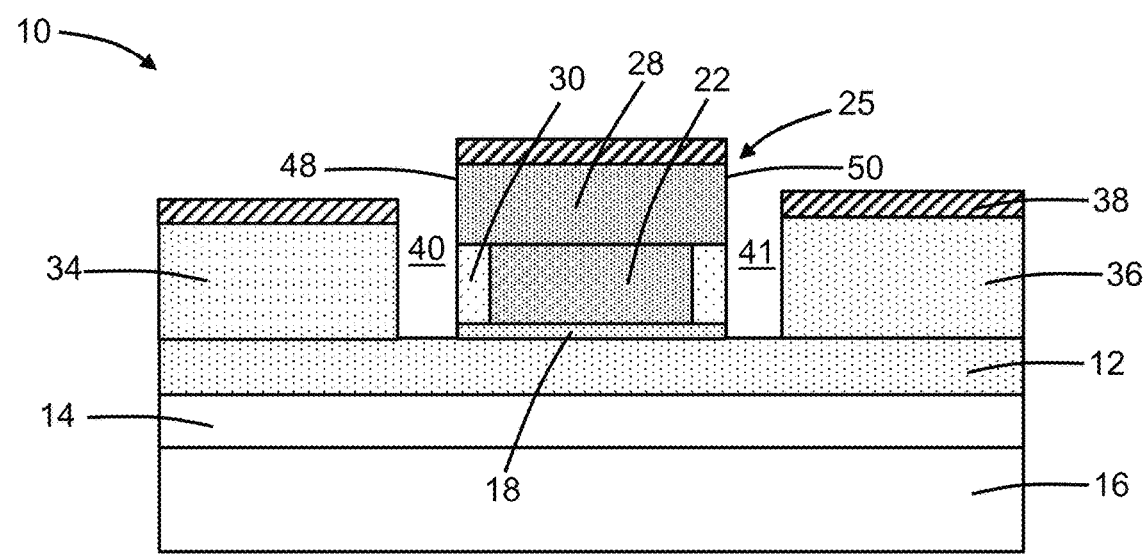
FIG. 6 is a cross-sectional view of the structure at a fabrication stage subsequent to FIG. 5.

With reference to FIG. 6 in which like reference numerals refer to like features in FIG. 5 and at a subsequent fabrication stage, the sidewall spacers 32 and the portion of the gate dielectric layer 18 beneath the sidewall spacers 32 may be removed by an etching process to form cavities 40, 41. In an embodiment, the material of the sidewall spacers 32 may be removed selective to the material of the bottom section 22 of the gate electrode 25, the material of the top section 28 of the gate electrode 25, the material of the sidewall spacers 30, and the material of the raised source/drain regions 34, 36. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The cavities 40, 41, which have respective open distal ends, terminate in a vertical direction with a closed proximal end at the plane of the semiconductor layer 12. The cavity 40 includes a lower portion disposed laterally between the raised source/drain region 34 and the sidewall spacer 30 adjacent to the raised source/drain region 34. The cavity 40 also includes an upper portion disposed laterally between the raised source/drain region 34 and the top section 28 of the gate electrode 25. The cavity 41 includes a lower portion disposed laterally between the raised source/drain region 36 and the sidewall spacer 30 adjacent to the raised source/drain region 36. The cavity 41 also includes an upper portion disposed laterally between the raised source/drain region 36 and the top section 28 of the gate electrode 25. The cavity 40 is disconnected from the cavity 41 such that the respective open spaces are distinct and isolated, and are not in fluid communication with each other. The raised source/drain regions 34, 36 enable the formation of the cavities 40, 41 by providing a boundary during the selective removal of the sidewall spacers 32.

Figure 7:
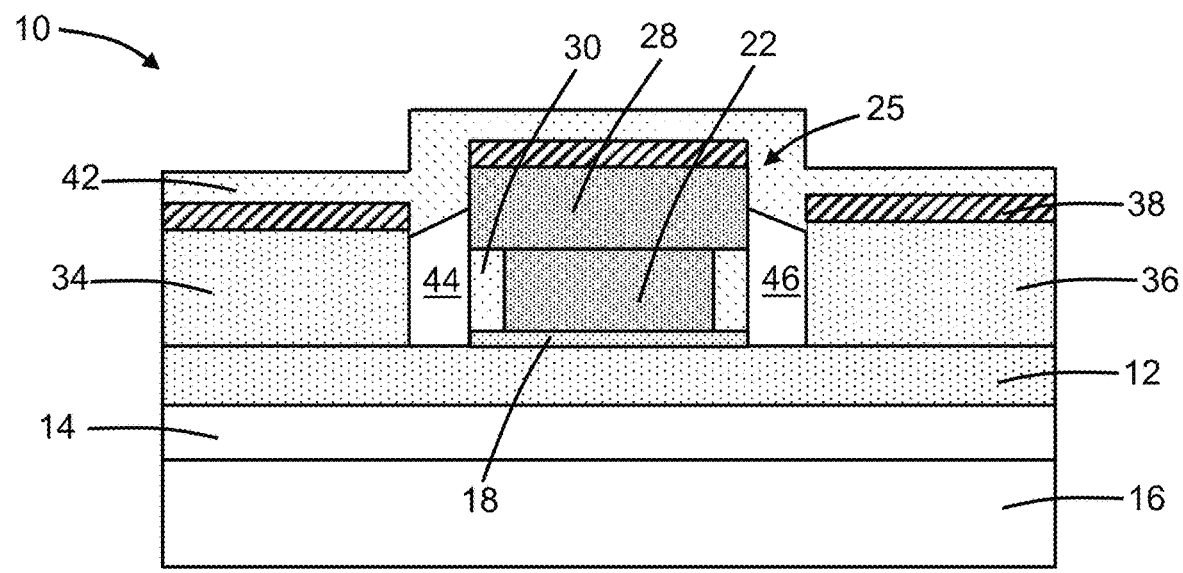
FIG. 7 is a cross-sectional view of the structure at a fabrication stage subsequent to FIG. 6.

With reference to FIG. 7 in which like reference numerals refer to like features in FIG. 6 and at a subsequent fabrication stage, a dielectric layer 42 is formed that extends over the entrance to the open distal end of each of the cavities 40, 41 and that also extends over the gate electrode 25 and the raised source/drain regions 34, 36. In an embodiment, the dielectric layer 42 may pinch-off to close the entrances to the open distal ends of the cavities 40, 41. The dielectric material of the dielectric layer 42 may deposit inside an upper portion of each of the cavities 40, 41 prior to pinch-off. The dielectric layer 42 may be comprised of a dielectric material, such as silicon dioxide, that is an electrical insulator.

Airgaps 44, 46 are trapped or formed inside the cavities 40, 41 as respective lower portions of the cavities 40, 41. The airgap 44 is disconnected from the airgap 46 such that the respective open spaces are distinct and isolated, and are not in fluid communication with each other. The airgaps 44, 46, which are unfilled by solid dielectric material, may be characterized by a permittivity or dielectric constant of near unity (i.e., vacuum permittivity). The airgaps 44, 46 may be filled by atmospheric air at or near atmospheric pressure, may be filled by another gas at or near atmospheric pressure, or may contain atmospheric air or another gas at a sub-atmospheric pressure (e.g., a partial vacuum). The reduced dielectric constant of the airgaps 44, 46 reduces the capacitive coupling between the gate electrode 25 and the raised source/drain regions 34, 36.

The airgap 44, which includes an upper portion and a lower portion between the upper portion and the semiconductor layer 12, is arranged in a lateral direction between the raised source/drain region 34 and the gate electrode 25. In an embodiment, a portion of the dielectric layer 42, which is arranged over the upper portion of the airgap 44, has an inclined surface facing toward the airgap 44 that arises from the height difference between the gate electrode 25 and the raised source/drain region 34. The portion of the dielectric layer 42 arranged over the upper portion of the airgap 44 is disposed in contact with a portion of the sidewall 48 (FIG. 6) of the top section 28 of the gate electrode 25 that faces toward the raised source/drain region 34. The lower portion of the airgap 44 is disposed between the raised source/drain region 34 and the adjacent sidewall spacer 30, and therefore disposed between the raised source/drain region 34 and the bottom section 22 of the gate electrode 25. The upper portion of the airgap 44 is disposed between the raised source/drain region 34 and the top section 28 of the gate electrode 25.

The airgap 46, which includes an upper portion and a lower portion between the upper portion and the semiconductor layer 12, is arranged in a lateral direction between the raised source/drain region 36 and the gate electrode 25. In an embodiment, a portion of the dielectric layer 42, which is arranged over the upper portion of the airgap 46, has an inclined surface facing toward the airgap 46 that arises from the height difference between the gate electrode 25 and the raised source/drain region 36. The portion of the dielectric layer 42 arranged over the upper portion of the airgap 46 is disposed in contact with a portion of the sidewall 50 (FIG.

6) of the top section 28 of the gate electrode 25 that faces toward the raised source/drain region 36. The lower portion of the airgap 46 is disposed between the raised source/drain region 36 and the adjacent sidewall spacer 30, and therefore disposed between the raised source/drain region 36 and the bottom section 22 of the gate electrode 25. The upper portion of the airgap 46 is disposed between the raised source/drain region 36 and the top section 28 of the gate electrode 25.

Figure 8:
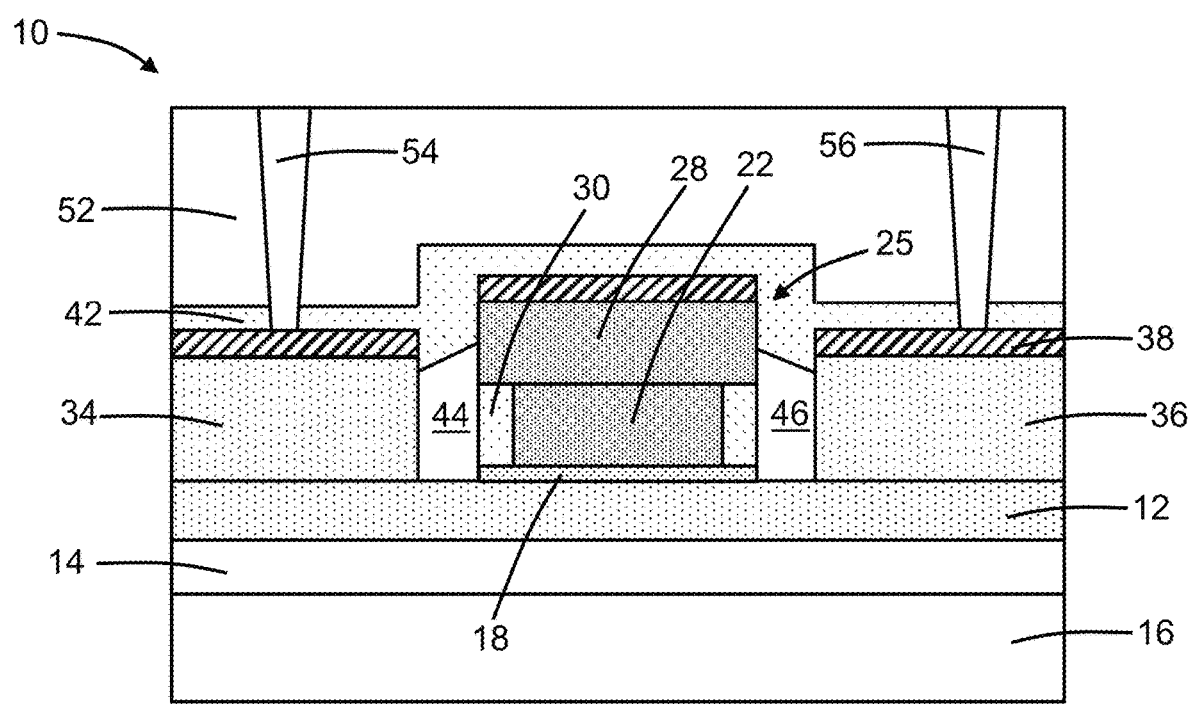
FIG. 8 is a cross-sectional view of the structure at a fabrication stage subsequent to FIG. 7.

With reference to FIG. 8 in which like reference numerals refer to like features in FIG. 7 and at a subsequent fabrication stage, a dielectric layer 52 is formed, and contacts 54, 56 are formed in the dielectric layer 52. The contact 54 is physically and electrically coupled to the section of the silicide layer 38 on the semiconductor layer of the raised source/drain region 34. The contact 56 is physically and electrically coupled to the section of the silicide layer 38 on the semiconductor layer of the raised source/drain region 36. The dielectric layer 52 may be comprised of a dielectric material, such as silicon dioxide, and the contacts 54, 56 may be comprised of a metal, such as tungsten. An etch stop layer (not shown) may be disposed between the dielectric layer 42 and the dielectric layer 52. The gate electrode 25 is also contacted by contacts (not shown). In an embodiment, the structure 10 may be configured as a switch field-effect transistor in which the gate electrode 25 includes gate fingers that are connected together at an end and contacted at that end, as well as additional raised source/drain 34, 36 and airgaps 44, 46 between the gate fingers of the gate electrode 25.

The T-shape of the gate electrode 25 may increase the breakdown voltage and reduce the overlap capacitance compared to conventional field-effect transistors lacking a T-shaped gate electrode. The raised source/drain regions 34, 36 enable the formation of the airgaps 44, 46, and the airgaps 44, 46 reduce the overlap capacitance and compensate for the increase in overlap capacitance originating from the raised source/drain regions 34, 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a semiconductor layer;
   a first raised source/drain region on the semiconductor layer;
   a second raised source/drain region on the semiconductor layer;
   a gate electrode laterally between the first raised source/drain region and the second raised source/drain region, the gate electrode including a first section and a second section between the first section and the semiconductor layer, the first section of the gate electrode having a first width, the second section of the gate electrode having a second width, and the first width greater than the second width;
   a first airgap including an upper portion and a lower portion between the upper portion and the semiconductor layer, the upper portion laterally between the first raised source/drain region and the first section of the gate electrode, and the lower portion laterally between the first raised source/drain region and the second section of the gate electrode;
   a second airgap laterally between the second raised source/drain region and the gate electrode; and
   a dielectric layer including an inclined surface extending over the upper portion of the first airgap from the first section of the gate electrode to the first raised source/drain region, the inclined surface of the dielectric layer facing the first airgap.

2. The structure of claim 1 further comprising:
   a first sidewall spacer between the second section of the gate electrode and the first airgap.

3. The structure of claim 2 further comprising:
   a second sidewall spacer between the second section of the gate electrode and the second airgap.

4. The structure of claim 3 wherein the second section of the gate electrode is disposed laterally between the first sidewall spacer and the second sidewall spacer.

5. The structure of claim 4 wherein the semiconductor layer has a top surface, and the second section of the gate electrode and the first sidewall spacer have equal thicknesses relative to the top surface.

6. The structure of claim 2 wherein the first section of the gate electrode includes a side edge portion that overlaps with the first sidewall spacer.

7. The structure of claim 6 wherein the first sidewall spacer is fully underneath the side edge portion of the first section of the gate electrode.

8. The structure of claim 6 wherein the semiconductor layer has a top surface, and the first sidewall spacer is fully disposed between the side edge portion of the first section of the gate electrode and the top surface of the semiconductor layer.

9. The structure of claim 1 wherein the first section of the gate electrode comprises a first material, and the second section of the gate electrode comprises a second material different from the first material.

10. The structure of claim 9 wherein the first material comprises silicon, and the second material comprises silicon-germanium.

11. The structure of claim 1 wherein the dielectric layer includes a first portion over the inclined surface, and the first portion of the dielectric layer extends over the first airgap from the first section of the gate electrode to the first raised source/drain region.

12. The structure of claim 11 wherein the dielectric layer includes a second portion extending over the second airgap from the first section of the gate electrode to the second raised source/drain region.

13. The structure of claim 12 wherein the dielectric layer further extends over the first section of the gate electrode, the first raised source/drain region, and the second raised source/drain region.

14. The structure of claim 11 wherein the gate electrode has a first height, and the first raised source/drain region has a second height that is less than the first height.

15. The structure of claim 11 wherein the first portion of the dielectric layer directly contacts the first section of the gate electrode above the first airgap.

16. The structure of claim 1 wherein the first section of the gate electrode comprises a first conductor layer, the second section of the gate electrode comprises a second conductor layer, and the first conductor layer adjoins the second conductor layer along an interface.

17. The structure of claim 1 wherein the first airgap is disconnected from the second airgap, and the gate electrode fully separates the first airgap from the second airgap.

18. A method of forming a structure for a field-effect transistor, the method comprising:
    forming a first raised source/drain region and a second raised source/drain region on a semiconductor layer;
    forming a gate electrode laterally between the first raised source/drain region and the second raised source/drain region, wherein the gate electrode includes a first section and a second section between the first section and the semiconductor layer, the first section of the gate electrode has a first width, the second section of the gate electrode has a second width, and the first width is greater than the second width;
    forming a first airgap including an upper portion and a lower portion between the upper portion and the semiconductor layer, wherein the upper portion is laterally between the first raised source/drain region and the first section of the gate electrode, and the lower portion is laterally between the first raised source/drain region and the second section of the gate electrode;
    forming a second airgap laterally between the second raised source/drain region and the gate electrode; and
    forming a dielectric layer including an inclined surface extending over the upper portion of the first airgap from the first section of the gate electrode to the first raised source/drain region, wherein the inclined surface of the dielectric layer faces the first airgap.

* * * * *